US009978601B2

(12) United States Patent
Tsai et al.

(10) Patent No.: US 9,978,601 B2
(45) Date of Patent: May 22, 2018

(54) METHODS FOR PRE-DEPOSITION TREATMENT OF A WORK-FUNCTION METAL LAYER

(71) Applicant: Taiwan Semiconductor Manufacturing Co., Ltd., Hsin-Chu (TW)

(72) Inventors: Cheng-Yen Tsai, New Taipei (TW); Hsin-Yi Lee, Hsinchu (TW); Chung-Chiang Wu, Taichung (TW); Da-Yuan Lee, Hsinchu County (TW); Weng Chang, Hsin-Chu (TW); Ming-Hsing Tsai, Chu-Pei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days. days.

(21) Appl. No.: 15/192,570

(22) Filed: Jun. 24, 2016

(65) Prior Publication Data

US 2017/0110324 A1      Apr. 20, 2017

Related U.S. Application Data

(60) Provisional application No. 62/244,097, filed on Oct. 20, 2015.

(51) Int. Cl.
*H01L 21/28* (2006.01)
*H01L 21/02* (2006.01)
(Continued)

(52) U.S. Cl.
CPC ........ *H01L 21/28105* (2013.01); *C23C 14/58* (2013.01); *C23C 14/5846* (2013.01);
(Continued)

(58) Field of Classification Search
CPC ..... H01L 29/43; H01L 29/4232; H01L 29/49; H01L 29/4966; H01L 29/4975;
(Continued)

(56) References Cited

U.S. PATENT DOCUMENTS 6,936,538 B2    8/2005   Byun
7,964,505 B2    6/2011   Khandelwal et al.
(Continued)

OTHER PUBLICATIONS

Farkhanda, et al., "Gate Workfunction Engineering for Deep Sub-Micron MOSFETS's: Motivation, Features and Challenges", IJECT, vol. 2, Issue 4, (2011), pp. 29-35.
(Continued)

*Primary Examiner* — Scott B Geyer
(74) *Attorney, Agent, or Firm* — Haynes and Boone, LLP

(57) ABSTRACT

A method and structure for providing a pre-deposition treatment (e.g., of a work-function layer) to accomplish work function tuning. In various embodiments, a gate dielectric layer is formed over a substrate, and a work-function metal layer is deposited over the gate dielectric layer. In some embodiments, a first in-situ process including a pre-treatment process of the work-function metal layer is performed. By way of example, the pre-treatment process removes an oxidized layer of the work-function metal layer to form a treated work-function metal layer. In some embodiments, after performing the first in-situ process, a second in-situ process including a deposition process of another metal layer over the treated work-function metal layer is performed.

20 Claims, 7 Drawing Sheets

(51) Int. Cl.
  *H01L 21/768* (2006.01)
  *C23C 14/58* (2006.01)
  *C23C 16/56* (2006.01)
  *C23C 16/455* (2006.01)
(52) U.S. Cl.
  CPC .... *C23C 14/5873* (2013.01); *C23C 16/45525* (2013.01); *C23C 16/56* (2013.01); *H01L 21/02697* (2013.01); *H01L 21/28088* (2013.01); *H01L 21/28097* (2013.01); *H01L 21/28185* (2013.01); *H01L 21/28194* (2013.01); *H01L 21/76838* (2013.01); *H01L 21/76886* (2013.01)
(58) Field of Classification Search
  CPC .. H01L 21/02697; H01L 21/28506–21/28593; H01L 21/32051–21/32053; H01L 21/32056; H01L 21/4763–21/47635; H01L 21/76879; H01L 21/28008; H01L 21/28088; H01L 21/28097; H01L 21/28105; H01L 21/76838; H01L 21/76853; H01L 21/76861; H01L 21/76864; H01L 21/76865; H01L 21/76886; C23C 16/06; C23C 16/45525; C23C 16/45531; C23C 14/58; C23C 14/5846; C23C 14/5873; C23C 16/56
  See application file for complete search history.

(56) References Cited

U.S. PATENT DOCUMENTS

| | | | |
|---|---|---|---|
| 9,343,372 B1 * | 5/2016 | Bao | H01L 29/401 |
| 9,455,150 B2 * | 9/2016 | Clendenning | H01L 29/7851 |
| 2012/0223397 A1 * | 9/2012 | Yang | H01L 21/28088 257/411 |
| 2014/0077313 A1 * | 3/2014 | Li | H01L 21/823842 257/410 |
| 2014/0239407 A1 | 8/2014 | Manabe et al. | |
| 2014/0273428 A1 * | 9/2014 | Shero | H01L 21/02211 438/592 |
| 2015/0243507 A1 * | 8/2015 | Harada | H01L 21/28008 438/592 |
| 2015/0311206 A1 * | 10/2015 | Hong | H01L 27/092 257/369 |
| 2015/0325447 A1 * | 11/2015 | Ogawa | H01L 21/28088 438/680 |
| 2016/0118261 A1 * | 4/2016 | Haukka | H01L 29/4966 438/592 |
| 2016/0163601 A1 * | 6/2016 | Xie | H01L 21/28088 257/392 |
| 2016/0163603 A1 * | 6/2016 | Bao | H01L 21/82384 257/412 |
| 2016/0254158 A1 * | 9/2016 | Kim | H01L 21/28158 438/591 |
| 2016/0268259 A1 * | 9/2016 | Chang | H01L 27/0922 |

OTHER PUBLICATIONS

Tao Zheng, et al.,"TiN/TaN Selective ETC in N10 RMG With Cholrine Based Plasmas", IMEC (2014), 23 pgs.

Xueli, et al., "An effective work-function tuning method of nMOSCAP with high-k/metal gate by TiN/TaN double-layer stack thickness", Journal of Semiconductors, vol. 35, No. 9, Sep. 2014, 4 pgs.

* cited by examiner

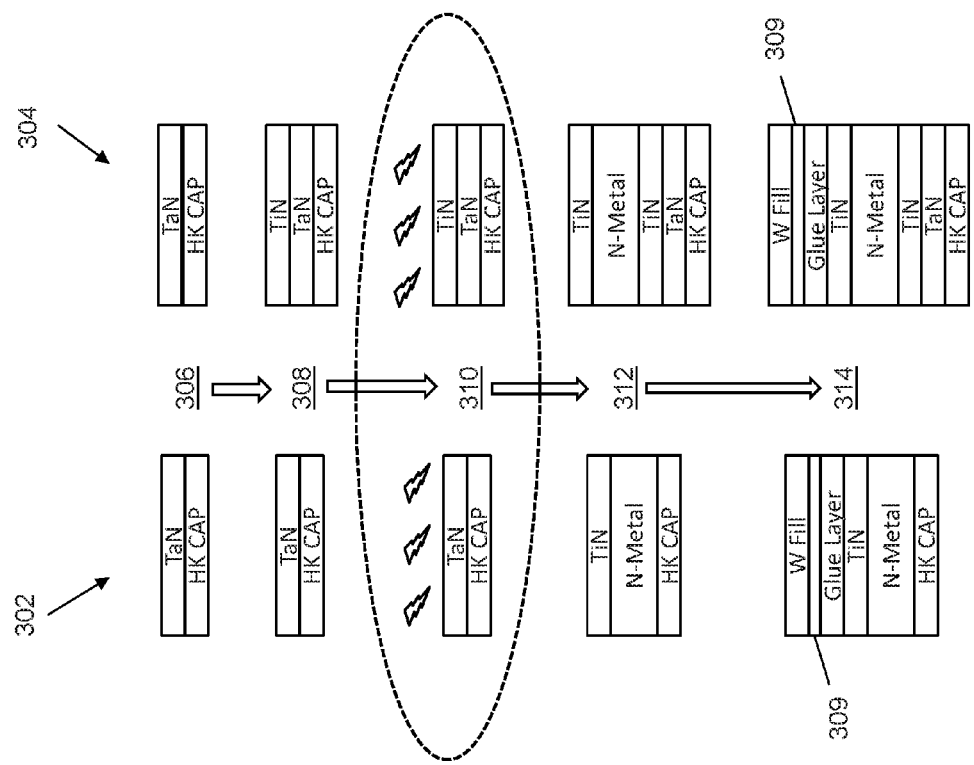

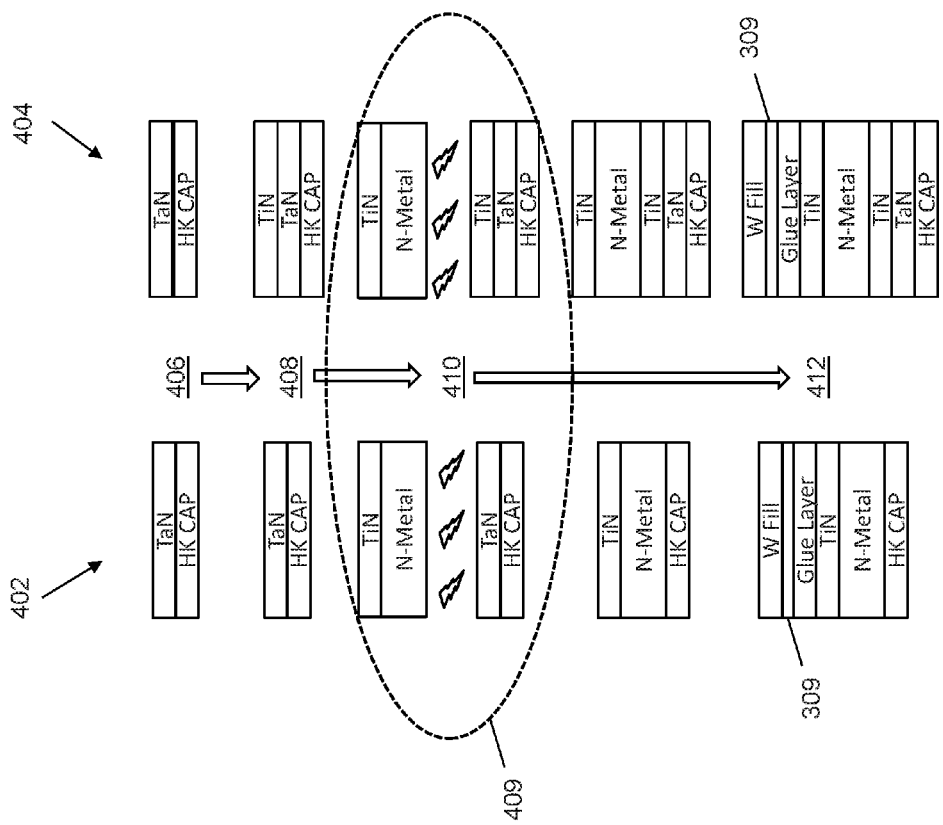

METHODS FOR PRE-DEPOSITION TREATMENT OF A WORK-FUNCTION METAL LAYER

CROSS-REFERENCE TO RELATED APPLICATION

This application claims the benefit of U.S. Provisional Application No. 62/244,097, filed Oct. 20, 2015.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

For example, as metal gate electrodes and high-K gate dielectrics have replaced traditional polysilicon gate electrodes and silicon dioxide dielectrics, one of the key challenges has been to find metal electrode layers having appropriate work function values. To that end, a variety of metal electrode layers, and combinations thereof, having a variety of work function values (e.g., near a conduction band-edge, near a valence band-edge, or near mid-gap) have been investigated for application in a variety of device types (e.g., 2D and/or 3D N-type/P-type FETs). Generally, much attention has been devoted to various work function tuning techniques. However, in at least some existing processes, the effective work function of a given metal layer is limited by lack of an adequate tuning knob. Some traditional work function tuning approaches merely adjust a thickness of the metal layer. For example, a thicker metal layer may be at times used in an effort to overcome work function metal loading effects. Additionally, in some existing processes, poor metal layer deposition may cause gaps or voids in the metal layer, detrimentally impacting device performance.

Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A illustrates cross-sectional diagrams of a first device processed according to an exemplary metal gate deposition process, in accordance with some embodiments;

FIG. 3B illustrates cross-sectional diagrams of a second device processed according to an exemplary metal gate deposition process, in accordance with some embodiments;

FIG. 4A illustrates cross-sectional diagrams of a first device processed according to an exemplary metal gate deposition process, and including an in-situ pre-deposition treatment, in accordance with some embodiments;

FIG. 4B illustrates cross-sectional diagrams of a second device processed according to an exemplary metal gate deposition process, and including an in-situ pre-deposition treatment, in accordance with some embodiments;

DETAILED DESCRIPTION

Figure 1A:
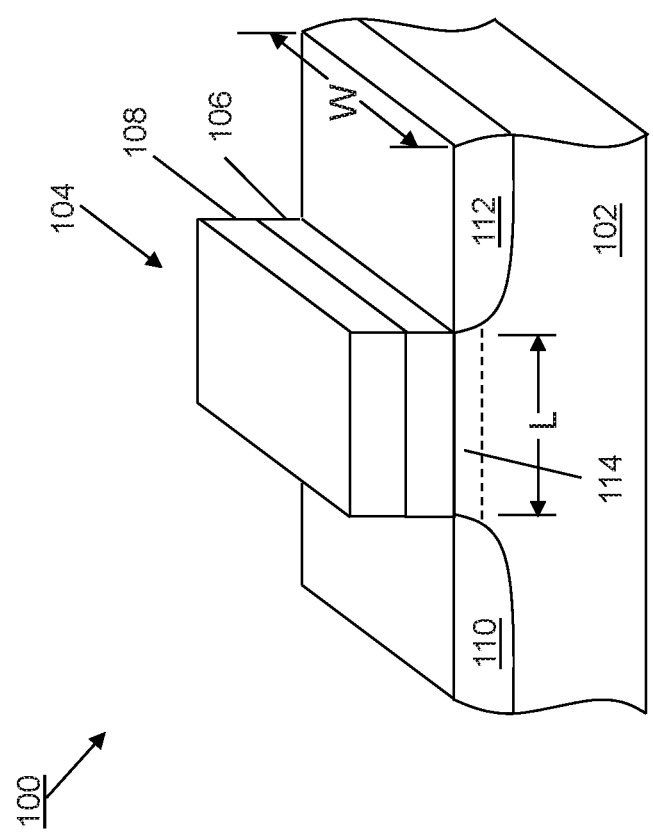
FIG. 1A is a cross-sectional view of an MOS transistor according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of methods of gate stack formation and related gate stack structures, which may be employed in any of a variety of device types. For example, embodiments of the present disclosure may be used to form gate stacks suitable for use in planar bulk metal-oxide-semiconductor field-effect transistors (MOSFETs), multi-gate transistors (planar or vertical) such as FinFET devices, gate-all-around (GAA) devices, Omega-gate (a-gate) devices, or Pi-gate (H-gate) devices, as well as strained-semiconductor devices, silicon-on-insulator (SOI) devices, partially-depleted SOI devices, fully-depleted SOI devices, or other devices as known in the art. In addition, embodiments disclosed herein may be employed in the formation of P-type and/or N-type devices. One of ordinary skill may recognize other embodiments of semiconductor devices that may benefit from aspects of the present disclosure. For example, some embodiments as described herein may also be applied to the formation of contacts, vias, or interconnects.

With reference to the example of FIG. 1A, illustrated therein is an MOS transistor 100, providing an example of merely one device type which may include embodiments of the present disclosure. It is understood that the exemplary transistor 100 is not meant to be limiting in any way, and those of skill in the art will recognize that embodiments of the present disclosure may be equally applicable to any of a variety of other device types, such as those described above. The transistor 100 is fabricated on a substrate 102 and includes a gate stack 104. The substrate 102 may be a semiconductor substrate such as a silicon substrate. The substrate 102 may include various layers, including conductive or insulating layers formed on the substrate 102. The substrate 102 may include various doping configurations depending on design requirements as is known in the art. The substrate 102 may also include other semiconductors such as germanium, silicon carbide (SiC), silicon germanium (SiGe), or diamond. Alternatively, the substrate 102 may include a compound semiconductor and/or an alloy semiconductor. Further, in some embodiments, the substrate 102 may include an epitaxial layer (epi-layer), the substrate 102 may be strained for performance enhancement, the substrate 102 may include a silicon-on-insulator (SOI) structure, and/or the substrate 102 may have other suitable enhancement features.

The gate stack 104 includes a gate dielectric 106 and a gate electrode 108 disposed on the gate dielectric 130. In some embodiments, the gate dielectric 106 may include an interfacial layer such as silicon oxide layer ($SiO_2$) or silicon oxynitride (SiON), where such interfacial layer may be formed by chemical oxidation, thermal oxidation, atomic layer deposition (ALD), chemical vapor deposition (CVD), and/or other suitable method. In some examples, the gate dielectric 106 includes a high-k dielectric layer such as hafnium oxide ($HfO_2$). Alternatively, the high-k dielectric layer may include other high-k dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. High-K gate dielectrics, as used and described herein, include dielectric materials having a high dielectric constant, for example, greater than that of thermal silicon oxide (~3.9). In still other embodiments, the gate dielectric 106 may include silicon dioxide or other suitable dielectric. The gate dielectric 106 may be formed by ALD, physical vapor deposition (PVD), oxidation, and/or other suitable methods. In some embodiments, the gate electrode 108 may be deposited as part of a gate first or gate last (e.g., replacement gate) process. In various embodiments, the gate electrode 108 includes a conductive layer such as W, TiN, TaN, WN, Re, Ir, Ru, Mo, Al, Cu, Co, Ni, combinations thereof, and/or other suitable compositions. In some examples, the gate electrode 108 may include a first metal material for an N-type transistor and a second metal material for a P-type transistor. Thus, the transistor 100 may include a dual work-function metal gate configuration. For example, the first metal material (e.g., for N-type devices) may include metals having a work function substantially aligned with a work function of the substrate conduction band, or at least substantially aligned with a work function of the conduction band of a channel region 114 of the transistor 100. Similarly, the second metal material (e.g., for P-type devices) may include metals having a work function substantially aligned with a work function of the substrate valence band, or at least substantially aligned with a work function of the valence band of the channel region 114 of the transistor 100. Thus, the gate electrode 104 may provide a gate electrode for the transistor 100, including both N-type and P-type devices. In some embodiments, the gate electrode 108 may alternately or additionally include a polysilicon layer. In various examples, the gate electrode 108 may be formed using PVD, CVD, electron beam (e-beam) evaporation, and/or other suitable process. In some embodiments, sidewall spacers are formed on sidewalls of the gate stack 104. Such sidewall spacers may include a dielectric material such as silicon oxide, silicon nitride, silicon carbide, silicon oxynitride, or combinations thereof.

The transistor 100 further includes a source region 110 and a drain region 112 each formed within the semiconductor substrate 102, adjacent to and on either side of the gate stack 104. In some embodiments, the source and drain regions 110, 112 include diffused source/drain regions, ion implanted source/drain regions, epitaxially grown regions, or a combination thereof. The channel region 114 of the transistor 100 is defined as the region between the source and drain regions 110, 112 under the gate dielectric 106, and within the semiconductor substrate 102. The channel region 114 has an associated channel length "L" and an associated channel width "W". When a bias voltage greater than a threshold voltage ($V_t$) (i.e., turn-on voltage) for the transistor 100 is applied to the gate electrode 108 along with a concurrently applied bias voltage between the source and drain regions 110, 112, an electric current (e.g., a transistor drive current) flows between the source and drain regions 110, 112 through the channel region 114. The amount of drive current developed for a given bias voltage (e.g., applied to the gate electrode 108 or between the source and drain regions 110, 112) is a function of, among others, the mobility of the material used to form the channel region 114. In some examples, the channel region 114 includes silicon (Si) and/or a high-mobility material such as germanium, as well as any of the plurality of compound semiconductors or alloy semiconductors as known in the art. High-mobility materials include those materials with electron and/or hole mobility greater than silicon (Si), which has an intrinsic electron mobility at room temperature (300 K) of around 1350 $cm^2$/V-s and a hole mobility of around 480 $cm^2$/V-s.

Figure 1B:
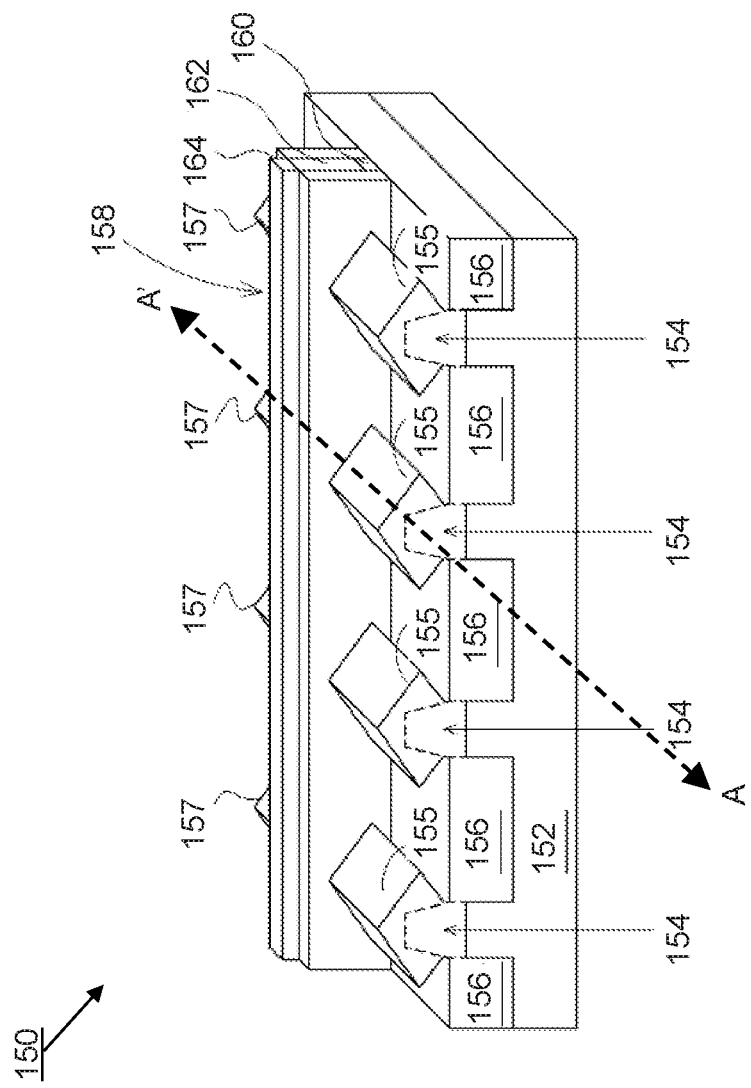
FIG. 1B is perspective view of an embodiment of a FinFET device according to one or more aspects of the present disclosure.

Referring to FIG. 1B, illustrated therein is a FinFET device 150, providing an example of an alternative device type which may include embodiments of the present disclosure. By way of example, the FinFET device 100 includes one or more fin-based, multi-gate field-effect transistors (FETs). The FinFET device 100 includes a substrate 152, at least one fin element 154 extending from the substrate 152, isolation regions 156, and a gate structure 158 disposed on and around the fin-element 154. The substrate 152 may be a semiconductor substrate such as a silicon substrate. In various embodiments, the substrate 152 may be substantially the same as the substrate 102, as described above.

The fin-element 154, like the substrate 152, may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins 154 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. In some embodiments, patterning the resist to form the making element may be performed using an electron beam (e-beam) lithography process. The masking element may then be used to protect regions of the substrate while an etch process forms recesses into the silicon layer, thereby leaving an extending fin 154. The recesses may be etched using a dry etch (e.g., chemical oxide removal), a wet etch, and/or other suitable processes. Numerous other embodiments of methods to form the fins 154 on the substrate 152 may also be used.

Each of the plurality of fins 154 also include a source region 155 and a drain region 157 where the source/drain regions 155, 157 are formed in, on, and/or surrounding the fin 154. The source/drain regions 155, 157 may be epitaxially grown over the fins 154. In addition, a channel region of a transistor is disposed within the fin 154, underlying the gate structure 158, along a plane substantially parallel to a plane defined by section AA' of FIG. IB. In some examples, the channel region of the fin includes a high-mobility material, as described above.

The isolation regions 156 may be shallow trench isolation (STI) features. Alternatively, a field oxide, a LOCOS feature, and/or other suitable isolation features may be implemented on and/or within the substrate 152. The isolation regions 156 may be composed of silicon oxide, silicon nitride, silicon oxynitride, fluorine-doped silicate glass (FSG), a low-k dielectric, combinations thereof, and/or other suitable material known in the art. In an embodiment, the isolation structures are STI features and are formed by etching trenches in the substrate 152. The trenches may then be filled with isolating material, followed by a chemical mechanical polishing (CMP) process. However, other embodiments are possible. In some embodiments, the isolation regions 156 may include a multi-layer structure, for example, having one or more liner layers.

The gate structure 158 includes a gate stack having an interfacial layer 160 formed over the channel region of the fin 154, a gate dielectric layer 162 formed over the interfacial layer 160, and a metal layer 164 formed over the gate dielectric layer 162. In various embodiments, the interfacial layer 160 is substantially the same as the interfacial layer described as part of the gate dielectric 106. In some embodiments, the gate dielectric layer 162 is substantially the same as the gate dielectric 106 and may include high-k dielectrics similar to that used for the gate dielectric 106. Similarly, in various embodiments, the metal layer 164 is substantially the same as the gate electrode 108, described above. In some embodiments, sidewall spacers are formed on sidewalls of the gate structure 158. The sidewall spacers may include a dielectric material such as silicon oxide, silicon nitride, silicon carbide, silicon oxynitride, or combinations thereof.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures directed to a pre-deposition treatment (e.g., of a work-function layer) and subsequent atomic layer deposition (ALD) process (e.g., subsequent ALD metal layer deposition), and the structures formed thereby. In some embodiments, the pre-deposition treatment and subsequent ALD process are performed in-situ, as described below. As used herein, the term "in-situ" is used to describe processes that are performed while a device or substrate remains within a processing system (e.g., including a load lock chamber, transfer chamber, processing chamber, or any other fluidly coupled chamber), and where for example, the processing system allows the substrate to remain under vacuum conditions. As such, the term "in-situ" may also generally be used to refer to processes in which the device or substrate being processed is not exposed to an external ambient (e.g., external to the processing system). In addition, while embodiments of the present disclosure may be primarily discussed with reference to N-type transistors, it will be understood that the embodiments disclosed herein may equally be applied to P-type transistors, where such implementations can be readily deduced by one skilled in the art, for example by symmetry to the N-type device implementations discussed below.

At least some embodiments of the present disclosure are directed to work function tuning for devices manufactured using a 10 nanometer or 7 nanometer process technology, although it will be understood that embodiments disclosed herein may be equally applied to other process technologies without departing from the scope of the present disclosure. In addition, embodiments of the present disclosure may be simultaneously used to ameliorate gap fill impact (e.g., by use of ALD processing). As used herein, the term "gap fill impact" may be used to describe the challenge of gate metal fill (e.g., in a replacement metal gate process). In some existing processes, poor metal gate deposition may cause gaps or voids in the metal gate, detrimentally impacting device performance. Embodiments of the present disclosure, which advantageously use ALD processing for metal gate layer deposition, provide high-quality, conformal metal gate layers that may be substantially void-free and thereby effectively mitigate potential problems associated with the gap fill impact. Additionally, in at least some existing processes (e.g., some 10 or 7 nanometer processes), the effective work function is limited by lack of an adequate tuning knob. Thus, there is a need for an effective work function tuning knob to further enhance device performance, for example, that goes beyond the traditional work function tuning approach of layer thickness adjustment. For example, in at least some existing processes (e.g., which employ ALD for gate stack deposition), work function tuning may be achieved by deposition of more ALD cycles to reduce metal surface loading effects.

As described above, embodiments of the present disclosure are directed to a pre-deposition treatment (e.g., of a work-function layer) and subsequent ALD process, and the structures formed thereby. As used herein, the term "pre-deposition treatment" may be used interchangeably with the terms "pre-treatment", "pre-deposition soak", or "pre-soak". Thus, various embodiments disclosed herein are based on cleaning an oxidized surface (e.g., of a work-function layer, upon which an ALD metal film will be subsequently deposited) by using a chlorine [Cl] and/or fluorine [F]-based metal precursor pre-soak or pre-treatment process. By employing this pre-soak/pre-treatment process, the work function of the subsequently deposited ALD metal film will not depend on a varying substrate surface or quality of an underlying substrate (e.g., such as an underlying work-function layer having an oxidized layer) that can reduce the growth rate (and thus the thickness) of the ALD metal film, thereby resulting in an improved device threshold voltage (Vt).

Thus, at least some advantages of the present disclosure include improving device Vt by using a [Cl] and/or [F]-based metal precursor pre-soak process to treat a work function setting layer (e.g., N-type work function layer), prior to deposition of an appropriate next metal layer (e.g. another work-function layer, barrier layer, cap layer, or other appropriate next metal layer), performed together/sequentially (e.g., in-situ) in a processing system such as a cluster tool (e.g., an ALD cluster tool where chambers are clustered together). To be sure, in some embodiments, a separate ex-situ pre-treatment (e.g., of the work-function layer) followed by deposition of the next metal layer may provide some advantages as well (e.g., threshold voltage improvement).

Stated in another way, based on free oxide by using [Cl]/[F]-based metal precursor pre-soak to clean up on oxidation surface of ALD metal film surface, the next work function of ALD metal film will not depend on different substrates to reduce their thickness growth rate and also get Vt improved. Vt will be improved by using [Cl]/[F]-based metal precursor pre-soak process and N-metal Work function layer-chamber clustered together.

Figure 2:
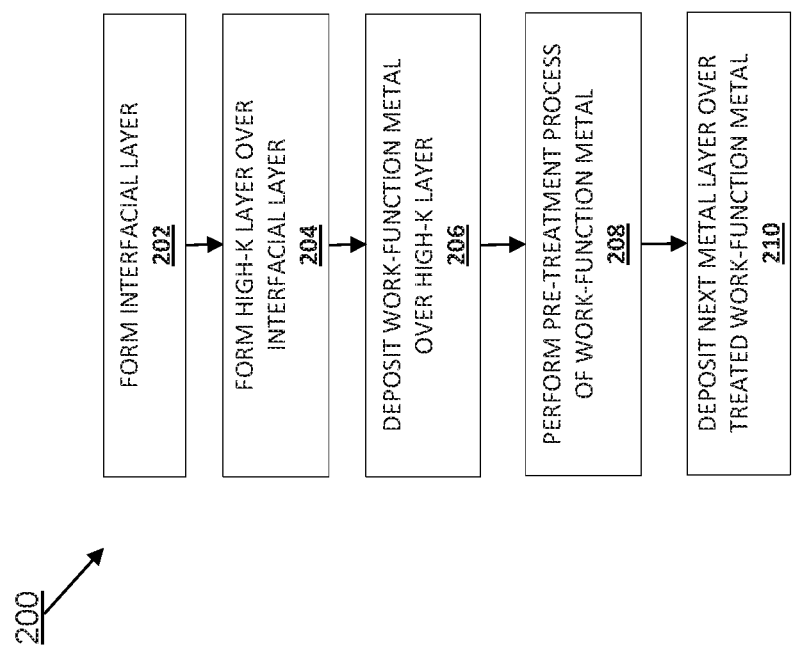
FIG. 2 is a flow chart of a method of performing a pre-deposition treatment of a work-function layer, in accordance with some embodiments.

Referring now to FIG. 2, illustrated is a method 200 of performing a pre-deposition treatment (e.g., of the work-function layer) and subsequent ALD process, in accordance with some embodiments. The method 200 may be implemented on a single-gate planar device, such as the exemplary transistor 100 described above with reference to FIG. 1A, as well as on a multi-gate device, such as the FinFET device 150 described above with reference to FIG. 1B. Thus, one or more aspects discussed above with reference to the transistor 100 and/or the FinFET 150 may also apply to the method 200. To be sure, in various embodiments, the method 200 may be implemented on other devices such as gate-all-around (GAA) devices, Omega-gate (Ω-gate) devices, or Pi-gate (Π-gate) devices, as well as strained-semiconductor devices, silicon-on-insulator (SOI) devices, partially-depleted SOI devices, fully-depleted SOI devices, or other devices as known in the art.

It is understood that parts of the method 200 and/or any of the exemplary transistor devices discussed with reference to the method 200 may be fabricated by a well-known complementary metal-oxide-semiconductor (CMOS) technology process flow, and thus some processes are only briefly described herein. Further, it is understood that any exemplary transistor devices discussed herein may include various other devices and features, such as additional transistors, bipolar junction transistors, resistors, capacitors, diodes, fuses, etc., but are simplified for a better understanding of the inventive concepts of the present disclosure. Further, in some embodiments, the exemplary transistor device(s) disclosed herein may include a plurality of semiconductor devices (e.g., transistors), which may be interconnected. In addition, in some embodiments, various aspects of the present disclosure may be applicable to either one of a gate-last process or a gate-first process.

In addition, in some embodiments, the exemplary transistor devices illustrated herein may include a depiction of a device at an intermediate stage of processing, as may be fabricated during processing of an integrated circuit, or portion thereof, that may comprise static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), complementary metal-oxide-semiconductor (CMOS) transistors, bipolar transistors, high voltage transistors, high frequency transistors, other memory cells, and/or combinations thereof.

Referring first to the method 200, the method 200 provides a general process flow for performing a pre-deposition treatment (e.g., of the work-function layer) and subsequent ALD process, in accordance with some embodiments. Additional details of the processes and exemplary related structures according to embodiments of the present disclosure are discussed in more detail below with reference to the examples of FIGS. 3A/3B and 4A/4B. The method 200 begins at block 202 where an interfacial layer is formed over the substrate 102, where the formed interfacial layer may be substantially similar to the interfacial layer described above as part of the gate dielectric 106. The method 200 proceeds to block 204 where a high-K dielectric layer is formed on the interfacial layer, where the high-K dielectric layer may be substantially similar to the high-K dielectric layer described above as part of the gate dielectric 106. In some cases, a high-K capping layer may be formed over the high-K dielectric layer.

After formation of the high-K dielectric layer, the method 200 then proceeds to block 206 where a work-function metal is deposited over the high-K dielectric layer. In some embodiments, the work-function metal is part of the gate electrode 108 described above with reference to FIG. 1A. Alternatively, in some embodiments, the work-function metal is part of the metal layer 164 described above with reference to FIG. 1B. As used herein, the term "work-function metal" is used to describe a layer which is used to set a value of the work function of the gate electrode 108. In various embodiments, the work-function metal may include TiN, TaN, TiAlC, TiAl, TiSiN, TaSi, TiAlN, a combination thereof, or other appropriate metal. Thus, in some embodiments, the work-function metal layer deposited over the high-K dielectric layer may include a plurality of layers configured to set the value of the work function of the gate electrode 108. In various examples, the work-function metal may be formed using ALD. By way of example, the work-function metal may be deposited by ALD at a temperature from about 200-600° C. In some cases, the work-function metal may alternately be formed using PVD, CVD, electron beam (e-beam) evaporation, and/or other suitable process. In some embodiments, a surface of the deposited work-function metal (e.g., deposited by ALD) may oxidize (e.g., due to exposure to an external ambient after deposition of the work-function metal), forming an ALD metal oxidation surface on the work-function metal layer.

In at least some existing processes, oxidation of the work-function metal (formation of the ALD metal oxidation surface) may result in a loading effect for a metal layer subsequently deposited on the oxidized work-function metal. As used herein, the term "loading effect" is used to describe an unwanted alteration of characteristics/properties of the metal layer deposited onto the oxidized work-function metal as a result of the oxidized work-function metal. Embodiments of the present disclosure provide for the removal (or substantial removal) of the oxidized layer of the work-function metal prior to the deposition of a subsequent metal layer, thereby preserving the desired characteristics/properties of the subsequently deposited metal layer.

The method 200 then proceeds to block 208 where a pre-treatment process of the work-function metal is performed. In an embodiment of the block 208, the ALD metal oxidation surface (e.g., the oxidized layer of the work-function metal) may be removed by a pre-treatment process that includes a Cl-based or F-based metal precursor to treat the ALD metal oxidation surface before depositing a subsequent metal film over the work-function metal. In some embodiments, the Cl-based or F-based metal precursor includes $TiCl_x$, $TaCl_x$, $TiF_x$, $HfCl_x$, $WF_x$, or $WCl_x$, where 'x' is equal to about 1-6. In various embodiments, the pre-treatment process, and the metal film deposition which follows, is an in-situ process, for example, performed within a processing system such as an ALD cluster tool. By way of example, and during the pre-treatment process, the Cl-based or F-based metal precursor may be introduced into a processing chamber of the processing system (e.g., where the processing chamber houses the substrate having the ALD metal oxidation surface), for example, at a pre-treatment processing temperature of about 300-1000° C., and at a flow rate of about 100-8000 standard cubic centimeters per minute (sccm). In various examples, the pre-treatment processing conditions (e.g., including selection of the Cl-based or F-based metal precursor, pre-treatment temperature, and flow rate of the Cl-based or F-based metal precursor) are selected so as to induce a thermal chemical reaction between the Cl-based or F-based metal precursor and the ALD metal oxidation surface, such that as a result of the pre-treatment process, the oxidized layer of the work-function metal is removed or cleaned off, thereby leaving behind an non-oxidized, clean work-function metal surface. To be sure, in some embodiments, a separate ex-situ pre-treatment (e.g., of the work-function layer) followed by deposition of the next metal layer may provide some advantages as well (e.g., threshold voltage improvement).

After the pre-treatment process, the method 200 then proceeds to block 210 where a next (subsequent) metal layer is deposited over the pre-treated work-function metal. In some embodiments, the next metal layer includes an N-metal layer (e.g., such as TiAlC) and a TiN layer over the N-metal layer, and in some examples the next metal layer may be deposited by ALD. By way of example, and in some embodiments, the next metal layer may also be part of the gate electrode 108 described above with reference to FIG. 1A. Alternatively, in some embodiments, the next metal layer may also be part of the metal layer 164 described above with reference to FIG. 1B. Additionally, in some embodiments, the next metal layer(s) deposited over the pre-treated work-function layer may include one or more other layers (e.g., in addition those described above). In some cases, the next metal layer(s) and any other layers deposited over the pre-treated work-function layer may also be used to set the value of the work function of the gate electrode 108. Of particular note, since the oxidized layer of the work-function metal was cleaned/removed during the pre-treatment process, as described above, the next metal layer may be deposited onto the non-oxidized, clean work-function metal surface. As such, the desired characteristics/properties of the deposited next metal layer are preserved, as the next metal layer is not subject to loading effects (e.g., due to an oxidized layer) of the underlying work-function metal. As a further result, embodiments of the present disclosure result in devices (e.g., the transistor 100) having improved threshold voltage and improved device reliability.

The device (e.g., the transistor 100) fabricated according to the method 200 may undergo further processing to form various features and regions known in the art. For example, subsequent processing may form various contacts/vias/lines and multilayers interconnect features (e.g., metal layers and interlayer dielectrics) on the substrate including the device, configured to connect the various features to form a functional circuit that may include one or more devices (e.g., one or more transistors 100). In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 200, and some process steps described above may be replaced or eliminated in accordance with various embodiments of the method 200.

Referring now to FIGS. 3A/3B and 4A/4B, illustrated therein are process flows for exemplary metal gate deposition processes. In particular, FIGS. 3A and 3B illustrate a process flow for a metal gate deposition process where the pre-treatment process of the work-function metal and the deposition of the next metal layer (e.g., TiAlC) on the pre-treated work-function metal are not performed in-situ. Alternatively, FIGS. 4A and 4B illustrate a process flow for a metal gate deposition process, in accordance with various embodiments, where the pre-treatment process of the work-function metal and the deposition of the next metal layer on the pre-treated work-function metal are performed in an in-situ manner. It is noted that FIGS. 3A/3B and 4A/4B illustrate exemplary compositions for the stack-up of layers (e.g., for a metal gate stack). These exemplary compositions are provided merely for ease of reference and not intended to be limiting beyond what is specifically claimed. Various compositions within the scope of the present disclosure may include (e.g., within a single gate stack) one or more work-function layers, one or more barrier layers, one or more capping layers, one or more metal fill layers, one or more polysilicon layers, one or more silicide layers, one or more doped layers, or other appropriate layers, including and/or beyond those layers that are specifically mentioned herein, and which may be configured as necessary or desired for a given technology or application. Additionally, in some embodiments, the pre-treatment process and subsequent metal layer deposition may be repeated multiple times for a given gate stack. In some examples, the pre-treatment process may be repeated multiple times to treat a particular metal layer (e.g., a particular work-function metal layer) prior to deposition of a subsequent metal layer.

Beginning with the exemplary processes of FIGS. 3A/3B, FIG. 3A illustrates a method 302 for the formation of an illustrative gate stack which may be used for a first type of device (e.g., for an N-type ultra-low threshold voltage (N-uLVT) device), and FIG. 3B illustrates a method 304 for the formation of an illustrative gate stack which may be used for a second type of device (e.g., for an N-type standard threshold voltage (N-SVT) device). It is noted that the illustrative gate stacks and exemplary processes shown and described with respect to FIGS. 3A/3B may be applied to any type of device, which for example employ any of a variety of different types of work function metal layer and/or combination of layers, as described above.

Referring first to step 306, each of the methods 302 (e.g., for the N-uLVT device) and 304 (e.g., for the N-SVT device) may begin with formation of a high-K capping layer (HK CAP), which may be formed over a high-K gate dielectric layer, such as described above. In some embodiments, the HK CAP layer may include a lanthanum-based oxide layer (e.g., $LaO_x$). In some examples, the HK CAP layer may include other layers such as an $Al_2O_3$ layer, a $SiO_2$ layer, a $Y_2O_3$ layer, a TiN layer, a TiSiN layer, a combination thereof, or other suitable capping layer. Still referring to the step 306, a TaN layer may be formed over the HK CAP layer for each of the methods 302 (e.g., for the N-uLVT device)

and 304 (e.g., for the N-SVT device). In various embodiments, the TaN layer may be the work-function metal, as described above. In various examples, the TaN layer may be part of the gate electrode 108 or the metal layer 164 described above with reference to FIG. 1A and FIG. 1B, respectively.

Referring next to step 308, a TiN layer may be formed over the TaN layer for the method 304 (e.g., for the N-SVT device). In various examples, the TiN layer may also be part of the gate electrode 108 or the metal layer 164 described above with reference to FIG. 1A and FIG. 1B, respectively. In some embodiments, formation of the TiN layer (e.g. over the TaN layer) may be performed to adjust the threshold voltage of the N-SVT device and/or to serve as an additional work-function metal. In some embodiments, a surface of the TaN layer (e.g., for the N-uLVT device) and/or a surface of the TiN layer (e.g., for the N-SVT device) may oxidize (e.g., due to exposure to an external ambient after deposition of the work-function metal), forming an ALD metal oxidation surface.

Referring next to step 310, each of the methods 302 (e.g., for the N-uLVT device) and 304 (e.g., for the N-SVT device) may proceed to performing a pre-treatment process. As described above, the pre-treatment process may include a Cl-based or F-based metal precursor such as $TiCl_x$, $TaCl_x$, $TiF_x$, $HfCl_x$, $WF_x$ or $WCl_x$, where 'x' is equal to about 1-6. By way of example, and during the pre-treatment process, the Cl-based or F-based metal precursor may be introduced into a processing chamber of the processing system (e.g., where the processing chamber houses the substrate having the ALD metal oxidation surface), for example, at a pre-treatment processing temperature of about 300-1000° C., and at a flow rate of about 100-8000 standard cubic centimeters per minute (sccm). In various examples, the pre-treatment processing conditions (e.g., including selection of the Cl-based or F-based metal precursor, pre-treatment temperature, and flow rate of the Cl-based or F-based metal precursor) may be selected so as to induce a thermal chemical reaction between the Cl-based or F-based metal precursor and a surface of the TaN layer (e.g., for the N-uLVT device), or between the Cl-based or F-based metal precursor and a surface of the TiN layer (e.g., for the N-SVT device). As a result of the pre-treatment process of step 310, an oxidized layer of the TaN layer (e.g., for the N-uLVT device) and/or an oxidized layer of the TiN layer (e.g., for the N-SVT device), is removed or cleaned off. In some examples, the TaN layer (e.g., for the N-uLVT device) may be substantially entirely oxidized. As such, in some embodiments, the pre-treatment process of step 310 may in some cases remove the entirety of such an entirely oxidized TaN layer (e.g., for the N-uLVT device), thereby exposing the underlying HK CAP layer (e.g., for the N-uLVT device).

Referring next to step 312, after performing the pre-treatment process of step 310, each of the devices (e.g., the N-uLVT device and the N-SVT device) may be removed from the processing system in which the pre-treatment process was performed. For example, each of the N-uLVT device and the N-SVT device may be transferred ex-situ to another processing system and/or another processing chamber of the processing system for subsequent processing. As a result of this ex-situ transfer, the previously cleaned TaN layer (e.g., for the N-uLVT device) and/or TiN layer (e.g., for the N-SVT device) may partially re-oxidize. In some examples, when the TaN layer (e.g., for the N-uLVT device) is substantially entirely oxidized and the pre-treatment process removes the entirety of such an oxidized TaN layer, the exposed and underlying HK CAP layer (e.g., for the N-uLVT device) may become partially oxidized. In some embodiments, and in spite of the potential for re-oxidation due to the ex-situ process, the pre-treatment process may still provide device performance improvement (e.g., due to improved Vt), as discussed in more detail below with reference to FIG. 6. Thereafter, still referring to step 312, and as shown in FIGS. 3A/3B, a TiN layer/N-metal layer stack (in some examples, a TiN/TiAlC stack, where for example the N-metal includes TiAlC) may then be deposited (e.g., by ALD) over each of the devices (e.g., the N-uLVT device and the N-SVT device). In various examples, the TiN layer/N-metal layer stack may be part of the gate electrode 108 or the metal layer 164 described above with reference to FIG. 1A and FIG. 1B, respectively. In some embodiments, due to the partial re-oxidation of underlying layers, the TiN layer/N-metal layer stack may be deposited onto a partially oxidized underlying surface. As such, the desired characteristics/properties of the deposited TiN layer/N-metal layer stack may be subject to some loading effects. However, it is noted that the pre-treatment process may still provide device performance improvement, in particular as compared to a device that does not undergo such a pre-treatment process. Thus, in some embodiments, devices (e.g., the transistor 100) fabricated in accordance with the embodiments of the methods 302/304 may exhibit an improved threshold voltage and improved device reliability, for example, as compared to a device that does not undergo such a pre-treatment process.

Referring now to step 314, a glue layer may be deposited over each of the TiN layer/N-metal layer stack (e.g., in some examples, by ALD) for each of the devices (e.g., the N-uLVT and N-SVT devices). In some examples, the glue layer includes a TiN BLK layer; however, other glue layers as known in the art may equally be used without departing from the scope of this disclosure. In some embodiments, a nucleation layer 309 (e.g., such as a tungsten (W) nucleation layer deposited by ALD) may be deposited over the glue layer, and a tungsten (W) fill layer may then be deposited (e.g., by ALD) over the nucleation layer 309. In various examples, the glue layer, the nucleation layer 309, and the W fill layer may be part of the gate electrode 108 or the metal layer 164 described above with reference to FIG. 1A and FIG. 1B, respectively. In addition, embodiments of the present disclosure, which advantageously use ALD processing for deposition of the metal gate layers, provide high-quality, conformal metal gate layers that may be substantially void-free and thereby effectively mitigate potential problems associated with the gap fill impact. Thus, by way of example and in some embodiments, the W fill layer may be deposited as a substantially void-free layer.

The illustrative devices (e.g., the N-uLVT and N-SVT devices) of the methods 302/304 may undergo further processing to form various features and regions known in the art. For example, subsequent processing may form various contacts/vias/lines and multilayers interconnect features (e.g., metal layers and interlayer dielectrics) on the substrate including the N-uLVT and N-SVT devices, configured to connect the various features to form a functional circuit that may include one or more N-uLVT and N-SVT devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the methods 302/304, and some process steps described above may be replaced or eliminated in accordance with various embodiments of the methods 302/304.

Referring now to FIGS. 4A and 4B, illustrated therein is a process flow for a metal gate deposition process, according to embodiments of the present disclosure, where the pre-treatment process of the work-function metal and the deposition of the next metal layer (e.g., such as TiAlC) on the pre-treated work-function metal are performed in an in-situ manner. Beginning with FIGS. 4A/4B, and in accordance with various embodiments, FIG. 4A illustrates a method 402 for the formation of an illustrative gate stack which may be used for a first type of device (e.g., for an N-type ultra-low threshold voltage (N-uLVT) device), and FIG. 4B illustrates a method 404 for the formation of an illustrative gate stack which may be used for a second type of device (e.g., for an N-type standard threshold voltage (N-SVT) device). It is noted that the illustrative gate stacks and exemplary processes shown and described with respect to FIGS. 4A/4B may be applied to any type of device, which for example employ any of a variety of different types of work function metal layer and/or combination of layers, as described above. In addition, it is noted that various aspects of the methods 402 and 404 are substantially similar to the methods 302 and 304, respectively, discussed above with reference to FIGS. 3A and 3B. Thus, for clarity of understanding, some aspects of the methods 402 and 404 may only be discussed briefly.

Referring first to step 406, and similar to the step 306 of the methods 302/304, each of the methods 402 (e.g., for the N-uLVT device) and 404 (e.g., for the N-SVT device) may begin with formation of a high-K capping layer (HK CAP), which may include a lanthanum-based oxide layer (e.g., $LaO_x$), an $Al_2O_3$ layer, a $SiO_2$ layer, a $Y_2O_3$ layer, a TiN layer, a TiSiN layer, a combination thereof, or other suitable capping layer. Still referring to the step 406, a TaN layer may be formed over the HK CAP layer for each of the methods 402 (e.g., for the N-uLVT device) and 404 (e.g., for the N-SVT device). In various embodiments, the TaN layer may be the work-function metal, as described above. In various examples, the TaN layer may be part of the gate electrode 108 or the metal layer 164 described above with reference to FIG. 1A and FIG. 1B, respectively.

Referring next to step 408, and similar to the step 308 of the methods 302/304, a TiN layer may be formed over the TaN layer for the method 404 (e.g., for the N-SVT device). In various examples, the TiN layer may also be part of the gate electrode 108 or the metal layer 164 described above with reference to FIG. 1A and FIG. 1B, respectively. In some embodiments, a surface of the TaN layer (e.g., for the N-uLVT device) and/or a surface of the TiN layer (e.g., for the N-SVT device) may oxidize (e.g., due to exposure to an external ambient after deposition of the work-function metal), forming an ALD metal oxidation surface.

Referring next to step 410, the methods 402 and 404 depart from the methods 302/304 discussed above. For example, while the methods 302/304 provided an ex-situ process for the pre-treatment process and subsequent TiN layer/N-metal layer stack formation (e.g., shown as separate steps 310 and 312), the methods 402/404 provide an in-situ process for the pre-treatment process and subsequent TiN layer/N-metal layer stack formation. By way of example, the two separate steps 310 and 312 of the methods 302/304 are combined into one in-situ step 410 of the methods 402/404.

It is noted that element 409 is used to indicate processes that are performed in-situ, as described herein, for each of the methods 402/404.

Thus, still referring to the step 410, each of the methods 402 (e.g., for the N-uLVT device) and 404 (e.g., for the N-SVT device) may proceed to performing a pre-treatment process. As described above, the pre-treatment process may include a Cl-based or F-based metal precursor such as $TiCl_x$, $TaCl_x$, $TiF_x$, $HfCl_x$, $WF_x$ or $WCl_x$, where 'x' is equal to about 1-6. By way of example, and during the pre-treatment process, the Cl-based or F-based metal precursor may be introduced into a processing chamber of the processing system (e.g., where the processing chamber houses the substrate having the ALD metal oxidation surface), for example, at a pre-treatment processing temperature of about 300-1000° C., and at a flow rate of about 100-8000 standard cubic centimeters per minute (sccm). In various examples, the pre-treatment processing conditions (e.g., including selection of the Cl-based or F-based metal precursor, pre-treatment temperature, and flow rate of the Cl-based or F-based metal precursor) are selected so as to induce a thermal chemical reaction between the Cl-based or F-based metal precursor and a surface of the TaN layer (e.g., for the N-uLVT device), or between the Cl-based or F-based metal precursor and a surface of the TiN layer (e.g., for the N-SVT device). As a result of the pre-treatment process, an oxidized layer of the TaN layer (e.g., for the N-uLVT device) and/or an oxidized layer of the TiN layer (e.g., for the N-SVT device), is removed or cleaned off. In some examples, the TaN layer (e.g., for the N-uLVT device) may be substantially entirely oxidized, as discussed above. As such, in some embodiments, the pre-treatment process may in some cases remove the entirety of such an entirely oxidized TaN layer (e.g., for the N-uLVT device), thereby exposing the underlying HK CAP layer (e.g., for the N-uLVT device).

For the in-situ process of FIGS. 4A/4B, after performing the pre-treatment process, the substrate being processed may remain within the processing system/chamber used to perform the pre-treatment process, so as to avoid exposure of the substrate to an external ambient (e.g., external to the processing system) and avoid potential re-oxidation of exposed layers. Thus, still with reference to step 410, after performing the pre-treatment process, and as shown in FIGS. 4A/4B, a TiN layer/N-metal layer stack (in some examples, a TiN/TiAlC stack) may then be formed over each of the devices (e.g., the N-uLVT device and the N-SVT device). In various examples, the TiN layer/N-metal layer stack may be part of the gate electrode 108 or the metal layer 164 described above with reference to FIG. 1A and FIG. 1B, respectively. Due to the in-situ nature of the methods of FIGS. 4A/4B, where any underlying layers remain non-oxidized and clean, the TiN layer/N-metal layer stack may be deposited onto a non-oxidized, clean underlying surface. As such, the desired characteristics/properties of the deposited TiN layer/N-metal layer stack are preserved, as the TiN layer/N-metal layer stack is not subject to loading effects (e.g., due to an oxidized layer) of the underlying layer(s). As a further result, devices (e.g., the transistor 100) fabricated in accordance with the embodiments of the methods 402/404 will have an improved threshold voltage and improved device reliability. In some embodiments, devices fabricated in accordance with the embodiments of the methods 402/404 may additionally exhibit an improved threshold voltage and improved device reliability, for example, as compared to a devices fabricated in accordance with the methods 302/304, described above.

Referring now to step 412, and similar to the step 314 of the methods 302/304, the glue layer may then be deposited over each of the TiN layer/N-metal layer stack (e.g., in some examples, by ALD) for each of the devices (e.g., the N-uLVT and N-SVT devices). As discussed above, and in some examples, the glue layer may include a TiN BLK layer; however, other glue layers as known in the art may equally be used without departing from the scope of this disclosure. In some embodiments, the nucleation layer 309 (e.g., such as a tungsten (W) nucleation layer deposited by ALD) may then be deposited over the glue layer, and a tungsten (W) fill layer may be deposited (e.g., by ALD) over the nucleation layer 309. In various examples, the glue layer, the nucleation layer 309, and the W fill layer may be part of the gate electrode 108 or the metal layer 164 described above with reference to FIG. 1A and FIG. 1B, respectively. In addition, embodiments of the present disclosure, which advantageously use ALD processing for deposition of the metal gate layers, provide high-quality, conformal metal gate layers that may be substantially void-free and thereby effectively mitigate potential problems associated with the gap fill impact. Thus, by way of example and in some embodiments, the W fill layer may be deposited as a substantially void-free layer.

The illustrative devices (e.g., the N-uLVT and N-SVT devices) of the methods 402/404 may undergo further processing to form various features and regions known in the art. For example, subsequent processing may form various contacts/vias/lines and multilayers interconnect features (e.g., metal layers and interlayer dielectrics) on the substrate including the N-uLVT and N-SVT devices, configured to connect the various features to form a functional circuit that may include one or more N-uLVT and N-SVT devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the methods 402/404, and some process steps described above may be replaced or eliminated in accordance with various embodiments of the methods 402/404.

Figure 5A:
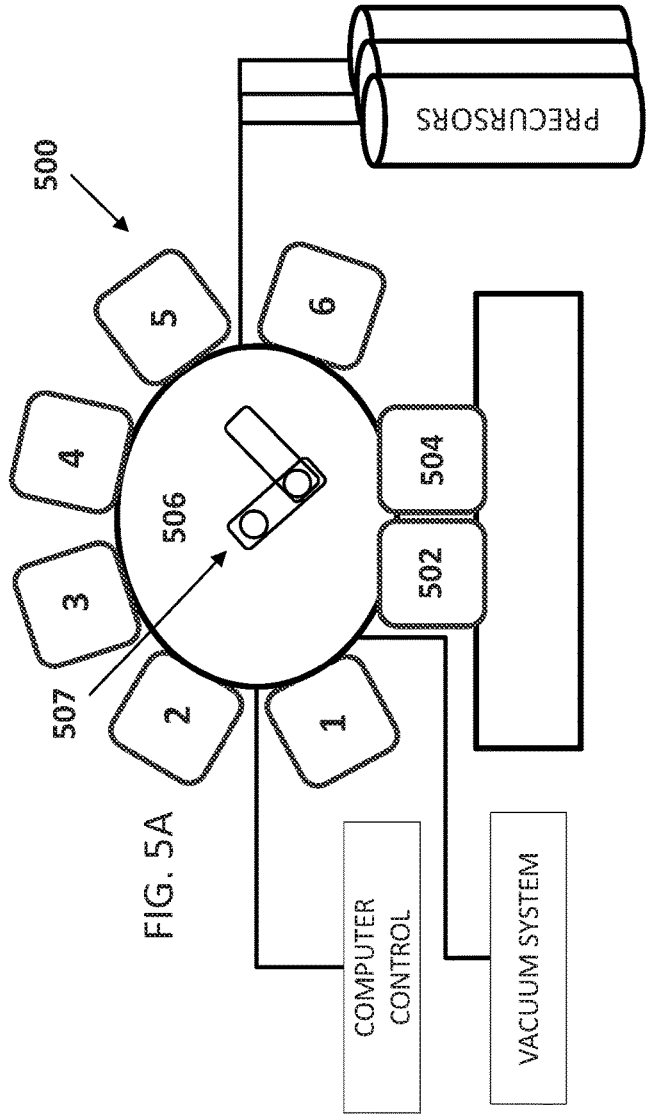
FIG. 5A is a schematic top-view diagram of an exemplary multi-chamber processing system, in accordance with some embodiments.

Referring now to FIG. 5A, illustrated therein is a schematic top-view diagram of an exemplary multi-chamber processing system 500. In some embodiments, the system 500 may be equivalently referred to as a "cluster tool". The system 500 may generally include load lock chambers 502, 504, a wafer handling chamber 506, and a plurality of processing chambers 1-6. In various embodiments, the load lock chambers 502, 504 provide for the transfer of substrates into and out of the system 500. In various embodiments, the system 500 is under vacuum (e.g., as provided by a vacuum system that may include mechanical pump, a turbomolecular pump, a cryo pump, or other appropriate vacuum pump), and the load lock chambers 502, 504 may "pump down" the substrates introduced into the system 500 (e.g., by way of the vacuum system). In some embodiments, the load lock chambers 502, 504 may be adapted to receive a single wafer or a plurality of wafers (e.g., loaded into a cassette). By way of example, the load lock chambers 502, 504 may be separated from the wafer handling chamber 506 by way of a gate valve, allowing the wafer handling chamber 506 to remain under vacuum when one or both of the load lock chambers 502, 504 are vented.

In various embodiments, the wafer handling chamber 506 is equipped with an automated, transfer arm 507 (e.g., robotic transfer arm) that may move smoothly along any of a horizontal, vertical, and/or rotational axis so as to transfer substrates between the load lock chambers 502, 504 and any of the substrate processing chambers 1-6. Each processing chamber 1-6 may be configured to perform a number of substrate processing operations such as atomic layer deposition (ALD), CVD, PVD, etching, pre-treatment/pre-soak, de-gassing, annealing, as well as a number of metrology operations such as XPS analysis, AFM analysis, and/or other suitable processing or metrology operations. In various embodiments, the system 500 may have more or less processing chambers, for example, as necessary for a particular process to be performed by the system 500.

Figure 5B:
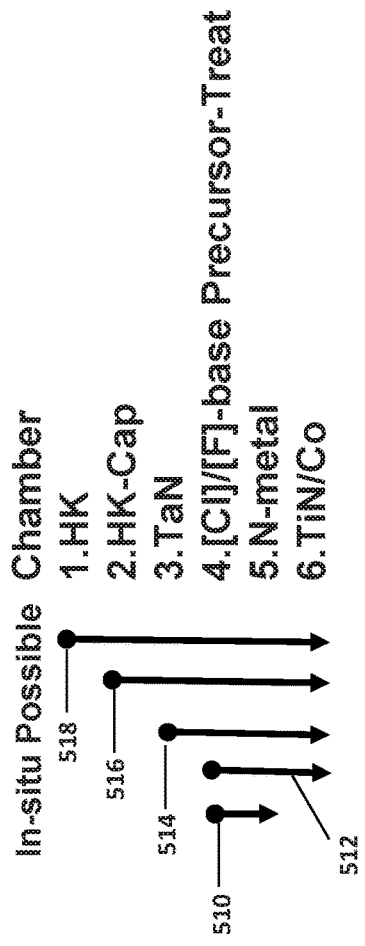
FIG. 5B shows an exemplary listing of possible configurations for each of the processing chambers of the processing system of FIG. 5A, as well as exemplary process flows which may be performed in-situ, in accordance with some embodiments.

Referring to the example of FIG. 5B, illustrated therein is an exemplary listing of possible configurations for each of the processing chambers 1-6 for the system 500 of FIG. 5A, according to some embodiments. For example, in some embodiments, processing chamber 1 may be configured for deposition of the high-K dielectric layer (e.g., as part of the gate dielectric 106); processing chamber 2 may be configured for deposition of TiN, TiSiN, and the HK CAP layer (or for deposition of a HK CAP layer which includes a TiN/TiSiN stack); processing chamber 3 may be configured for deposition of TaN; processing chamber 4 may be configured to perform the [Cl] and/or fluorine [F]-based metal precursor pre-soak or pre-treatment process; processing chamber 5 may be configured for deposition of the N-metal layer (e.g., such as TiAlC); and processing chamber 6 may be configured for deposition of TiN or TiN/Co. It will be understood that these processing chamber configurations are merely exemplary, and are not meant to be limiting in any way. By way of illustration, the in-situ processes described above may include processes that are performed within a given processing chamber (e.g., processing chamber 1-6), or may include processes where a first process is performed in a first processing chamber, and the substrate is transferred to a second processing chamber (e.g., via the wafer handling chamber 506), where a second process is performed in the second processing chambers. Regardless of the implementation of the in-situ process, the in-situ processes described herein may include processes that are performed while a device or substrate remains within the system 500 (e.g., including the load lock chambers 502, 504, the wafer handling chamber 506, and/or any of the processing chambers 1-6), and where for example, the system 500 remains under vacuum.

FIG. 5B also illustrates, by way of arrows 510, 512, 514, 516, 518, some exemplary process flows which may be performed in-situ. For example, with reference to arrow 510 and in some illustrative examples, the [Cl] and/or fluorine [F]-based metal precursor pre-treatment process (chamber 4) and the N-metal layer deposition (chamber 5) may both be performed in-situ (and in some cases, sequentially). As another example, with reference to arrow 512 and in some illustrative examples, the [Cl] and/or fluorine [F]-based metal precursor pre-treatment process (chamber 4), the N-metal layer deposition (chamber 5), and the TiN or TiN/Co deposition (chamber 6) may all be performed in-situ (and in some cases, sequentially). With reference to the example of arrow 514 and in some illustrative embodiments, the TaN layer deposition (chamber 3), the [Cl] and/or fluorine [F]-based metal precursor pre-treatment process (chamber 4), the N-metal layer deposition (chamber 5), and the TiN or TiN/Co deposition (chamber 6) may all be performed in-situ (and in some cases, sequentially). Referring to the example of arrow 516 and in some illustrative embodiments, the HK CAP layer deposition (chamber 2), the TaN layer deposition (chamber 3), the [Cl] and/or fluorine [F]-based metal precursor pre-treatment process (chamber 4), the N-metal layer deposition (chamber 5), and the TiN or TiN/Co deposition (chamber 6) may all be performed in-situ (and in some cases, sequentially). With reference to the example of arrow 518 and in some illustrative embodiments, the high-K dielectric layer deposition (chamber 1), the HK CAP layer deposition (chamber 2), the TaN layer deposition (chamber 3), the [Cl] and/or fluorine [F]-based metal precursor pre-treatment process (chamber 4), the N-metal layer deposition (chamber 5), and the TiN or TiN/Co deposition (chamber 6) may all be performed in-situ (and in some cases, sequentially).

Figure 6:
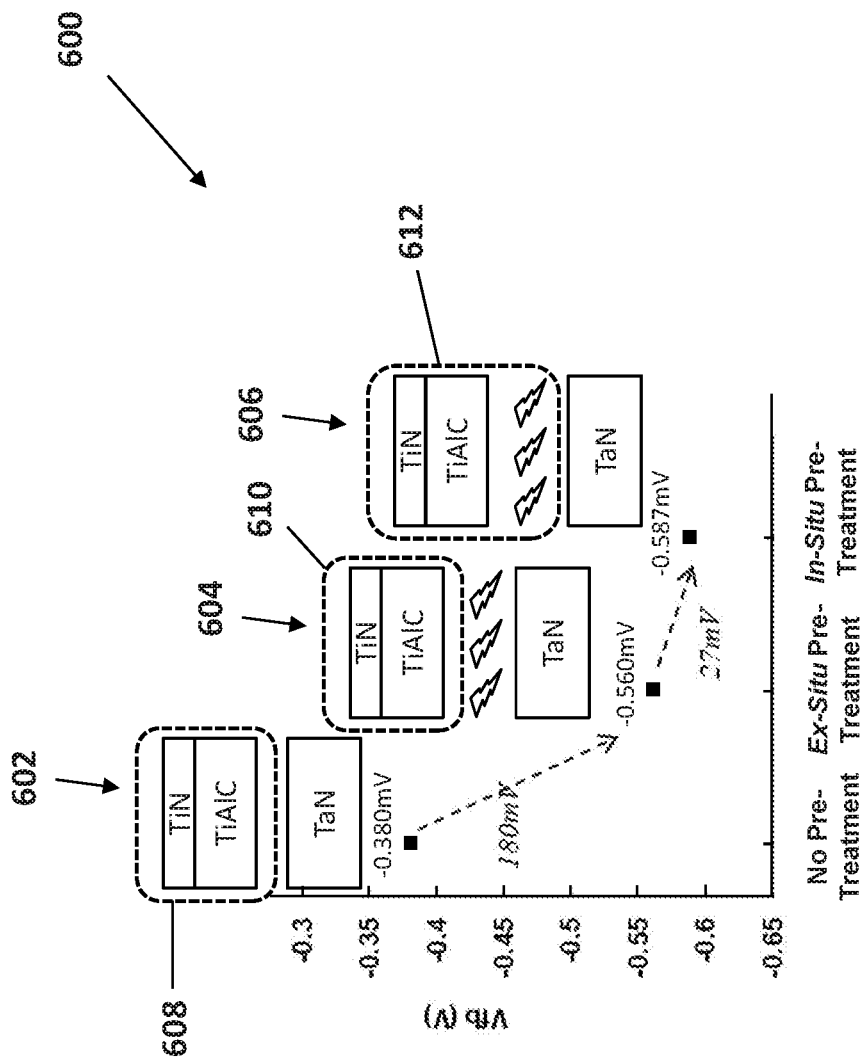
FIG. 6 illustrates a graph showing flatband voltage (Vfb) as a function of various processing conditions, in accordance with some embodiments.

Referring now to FIG. 6, illustrated therein is a graph 600 showing flatband voltage (Vfb) as a function of various processing conditions, and further illustrating the benefit to device threshold voltage (Vt) for devices processed according to embodiments of the present disclosure. For clarity of discussion, it is noted that transistor threshold voltage (Vt) and flatband voltage (Vfb) may be generally expressed as:

$$V_t = V_{fb} + \frac{\sqrt{2q\epsilon N_A 2\varphi_B}}{C_{ox}}$$

$$V_{fb} = \varphi_{ms} + 2\varphi_B - \frac{Q_f}{C_{ox}}$$

From these two expressions for Vt and Vfb, it is clear that Vt is affected by changes in the flatband voltage. As a point of reference, consider devices 602, 604, and 606, which include a TiAlC layer over a TaN layer, and a TiN layer over the TiAlC layer. In some cases, the TaN layer may be the work-function layer described above, the TiAlC layer may be the N-metal layer described above, and the TiN layer may be part of the next metal layer described above (which may include the stack of both TiAlC and TiN). By way of example, and in some embodiments, the TaN layer may have a thickness of about 15 Angstroms, and the TiN layer may have a thickness of about 10 Angstroms. Further, it is noted that elements 608, 610, and 612 are used to indicate processes that may be performed in-situ, as described above, for each of the devices 602, 604, and 606, respectively. Additionally, lighting bolt symbols (which were also used in FIGS. 3A/3B and 4A/4B) are used to indicate that the pre-treatment process is performed for the given devices (604 and 606).

Thus, beginning with device 602, it is noted that the pre-treatment process described herein is not performed. After deposition of the TaN layer, the TiAlC and TiN layers may be deposited sequentially, in-situ over the TaN layer. The resulting device fabricated having the device 602 is measured to have a flatband voltage (Vfb) equal to about −380 mV.

Referring next to the device 604, after deposition of the TaN layer, an ex situ pre-treatment process may be performed, for example, as described above with reference to the methods 302/304. In the example of FIG. 6, the pre-treatment process applied to the TaN layer of the device 604 may include a WCl$_5$ gas treatment. However, as described above, other [Cl] and/or fluorine [F]-based metal precursors may be used to perform the pre-treatment process described herein. Thereafter, the TiAlC and TiN layers may be deposited sequentially, in-situ over the pre-treated TaN layer. The resulting device fabricated including the device 604 is measured to have a flatband voltage (Vfb) equal to about −560 mV. Thus, the WCl$_5$ gas treatment for the device 604 results in about a −180 mV Vfb shift as compared to the device 602, which did not undergo the pre-treatment process. Stated another way, the WCl$_5$ gas treatment for the device 604 results in about a ~180 mV band-edge shift for the TaN layer. In some embodiments, "band-edge shift" may be used to describe the conduction band edge shift (e.g., for NMOS transistors) or valence band edge shift (e.g., for PMOS transistors), such that the pre-treatment process can be said to have tuned the work-function of the work-function layer (e.g., the TaN layer).

With reference to the device 606, after deposition of the TaN layer, an in-situ pre-treatment process may be performed, for example, as described above with reference to the methods 402/404. In the example of FIG. 6, the pre-treatment process applied to the TaN layer of the device 604 may include a WCl$_5$ gas treatment. However, as described above, other [Cl] and/or fluorine [F]-based metal precursors may be used to perform the pre-treatment process described herein. After performing the pre-treatment process (e.g., of the TaN layer for the device 606), the substrate being processed may remain within the processing system/chamber used to perform the pre-treatment process, so as to avoid exposure of the substrate to an external ambient (e.g., external to the processing system) and avoid potential re-oxidation of exposed layers (e.g., of the TaN layer). Thus, after performing the pre-treatment process, the TiAlC and TiN layers may be deposited sequentially, in-situ over the pre-treated TaN layer. The resulting device fabricated including the device 606 is measured to have a flatband voltage (Vfb) equal to about −587 mV. Thus, the combined in-situ WCl$_5$ gas treatment and subsequent deposition of the TiAlC and TiN layers for the device 606 results in about a −27 mV Vfb shift as compared to the device 604, where the ex situ pre-treatment process is performed. Stated another way, the combined in-situ WCl$_5$ gas treatment and subsequent deposition of the TiAlC and TiN layers for the device 606 results in about an additional ~27 mV band-edge shift for the TaN layer, as compared to the device 604.

The various embodiments described herein offer several advantages over the existing art. It will be understood that not all advantages have been necessarily discussed herein, no particular advantage is required for all embodiments, and other embodiments may offer different advantages. As one example, embodiments discussed herein include methods and structures directed to a pre-deposition treatment (e.g., of a work-function layer) and subsequent atomic layer deposition (ALD) process (e.g., subsequent ALD metal layer deposition) over the pre-treated layer. In addition, embodiments of the present disclosure may be effectively employed to accomplish work function tuning, as described above. In various embodiments, the pre-deposition treatment process (pre-treatment process) includes cleaning an oxidized surface (e.g., of a work-function layer) by using a chlorine [Cl] and/or fluorine [F]-based metal precursor pre-soak or pre-treatment process. The pre-treatment process described herein may effectively mitigate metal surface loading effects (e.g., of the work-function layer), thereby resulting in an improved device threshold voltage (Vt). Thus, at least some advantages of the present disclosure include improving device Vt by using a [Cl] and/or [F]-based metal precursor pre-soak process to treat a work function setting layer (e.g., N-type work function layer), prior to deposition of an appropriate next metal layer (e.g. another work-function layer, barrier layer, cap layer, or other appropriate next metal layer), performed together/sequentially (e.g., in-situ) in a processing system such as a cluster tool (e.g., an ALD cluster tool where chambers are clustered together). Embodiments of the present disclosure may also be simultaneously used to ameliorate gap fill impact (e.g., by use of ALD processing), as described above. To be sure, in some embodiments, a separate ex-situ pre-treatment (e.g., of the work-function layer) followed by deposition of the next metal layer may provide some advantages as well (e.g., threshold voltage improvement).

Thus, one of the embodiments of the present disclosure described a method for fabricating a semiconductor device, where the method includes forming a gate dielectric layer over a substrate, and depositing a work-function metal layer over the gate dielectric layer. In some embodiments, a first in-situ process including a pre-treatment process of the work-function metal layer is performed. By way of example, the pre-treatment process removes an oxidized layer of the work-function metal layer to form a treated work-function metal layer. In some embodiments, after performing the first in-situ process, a second in-situ process including a deposition process of another metal layer over the treated work-function metal layer is performed.

In another of the embodiments, discussed is a method where a gate dielectric layer is formed over a substrate in a first chamber of an evacuated processing system. Thereafter, while maintaining a vacuum condition of the processing system, a work-function metal layer is deposited over the gate dielectric layer in a second chamber of the evacuated processing system. In some embodiments, the substrate is transferred to a third chamber of the evacuated processing system, while maintaining the vacuum condition of the evacuated processing system, and a pre-treatment process of the work-function metal layer is performed in the third chamber, thereby forming a treated work-function metal layer. By way of example, the substrate may then be transferred to a fourth chamber of the evacuated processing system, while maintaining the vacuum condition of the evacuated processing system, and a subsequent metal layer may be deposited over the treated work-function metal layer in the fourth chamber.

In yet another of the embodiments, discussed is a device including a substrate having a gate stack formed thereon. By way of example, the device further includes a gate dielectric layer disposed over the substrate, a pre-treated work-function metal layer, having a non-oxidized surface, disposed over the gate dielectric layer, and a subsequent metal layer disposed over the non-oxidized surface of the pre-treated work-function metal layer. In various embodiments, the pre-treated work-function metal layer and the subsequent metal layer include atomic layer deposition (ALD)-deposited layers formed sequentially within a multi-chamber processing system, while maintaining a vacuum condition of the multi-chamber processing system.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor device fabrication, comprising:
   forming a gate dielectric layer over a substrate;
   depositing a work-function metal layer over the gate dielectric layer;
   performing a first in-situ process including a pre-treatment process of the work-function metal layer, wherein the pre-treatment process removes an oxidized layer of the work-function metal layer to form a treated work-function metal layer; and
   after performing the first in-situ process, performing a second in-situ process including a deposition process of another metal layer over the treated work-function metal layer.

2. The method of claim 1, wherein the first in-situ process is performed in a first chamber of a processing system, and wherein the second in-situ process is performed in a second chamber of the processing system.

3. The method of claim 2, wherein the first and second in-situ processes are performed while maintaining a vacuum condition of the processing system.

4. The method of claim 1, wherein the pre-treatment process includes at least one of a Cl-based and a F-based metal precursor.

5. The method of claim 4, wherein a flow rate of the precursor is between approximately 100 sccm and approximately 8000 sccm.

6. The method of claim 1, wherein the work-function metal layer includes at least one of TiN, TaN, TiAlC, TiAl, TiSiN, TaSi, and TiAlN.

7. The method of claim 1, wherein the work-function metal is deposited at a temperature from approximately 200 degrees Celsius to approximately 600 degrees Celsius.

8. The method of claim 1, wherein the pre-treatment process is performed at a temperature from approximately 300 degrees Celsius to approximately 1000 degrees Celsius.

9. The method of claim 1, wherein the work-function metal layer and the another metal layer are deposited by atomic layer deposition.

10. The method of claim 1, wherein the another metal layer includes a TiAlC layer.

11. The method of claim 1, further comprising performing a third in-situ process including depositing a TiN layer over the TiAlC layer.

12. The method of claim 1, wherein the pre-treatment process shifts a band edge of the work-function metal layer.

13. A method of semiconductor device fabrication, comprising:
   in a first chamber of an evacuated processing system, forming a gate dielectric layer over a substrate;
   while maintaining a vacuum condition of the processing system, depositing a work-function metal layer over the gate dielectric layer in a second chamber of the evacuated processing system;
   transferring the substrate to a third chamber of the evacuated processing system, while maintaining the vacuum condition of the evacuated processing system, and performing a pre-treatment process of the work-function metal layer in the third chamber, thereby forming a treated work-function metal layer; and
   transferring the substrate to a fourth chamber of the evacuated processing system, while maintaining the vacuum condition of the evacuated processing system, and depositing a subsequent metal layer over the treated work-function metal layer in the fourth chamber.

14. The method of claim 13, wherein the pre-treatment process removes an oxidized layer from a top surface of the work-function metal layer.

15. The method of claim 13, wherein the work-function metal layer includes an N-type work function metal layer.

16. The method of claim 13, wherein the subsequent metal layer includes a TiAlC layer.

17. The method of claim 16, further comprising depositing a TiN layer over the TiAlC layer.

18. A method, comprising:
    forming a high-K gate dielectric layer disposed over a fin-element;
    depositing a work-function metal layer over the high-K gate dielectric layer;
    performing a pre-treatment process of the work-function metal layer, wherein the pre-treatment process includes at least one of a Cl-based and a F-based metal precursor, and wherein the pre-treatment process removes an oxidized layer of the work-function metal layer, thereby forming a treated work-function metal layer; and
    after performing the pre-treatment process, depositing a TiAlC layer over the treated work-function metal layer.

19. The method of claim 18, wherein each of the forming the high-K gate dielectric layer, depositing the work-function metal layer, performing the pre-treatment process, and depositing the TiAlC layer are executed sequentially within a multi-chamber processing system, while maintaining a vacuum condition of the multi-chamber processing system.

20. The method of claim 18, wherein the work-function metal layer includes at least one of TiN, TaN, TiAlC, TiAl, TiSiN, TaSi, and TiAlN.

\* \* \* \* \*